United States Patent
Park

(10) Patent No.: US 6,323,639 B1
(45) Date of Patent: Nov. 27, 2001

(54) POWERING DIES ON A SEMICONDUCTOR WAFER THROUGH WAFER SCRIBE LINE AREAS

(75) Inventor: Eungjoon Park, Fremont, CA (US)

(73) Assignee: Azalea Microelectronics Corporation, Santa Clara, CA (US)

( * ) Notice: Subject to any disclaimer, the term of this patent is extended or adjusted under 35 U.S.C. 154(b) by 0 days.

(21) Appl. No.: 09/542,802

(22) Filed: Apr. 4, 2000

(51) Int. Cl.$^7$ .................................................. G01R 1/04
(52) U.S. Cl. .................... 324/158.1; 438/106; 438/113; 438/612
(58) Field of Search ................ 324/158.1, 73.1; 438/14, 15, 106; 371/21.4; 257/66, 347; 365/51

(56) References Cited

U.S. PATENT DOCUMENTS

| | | | |
|---|---|---|---|
| 5,404,099 | * 4/1995 | Sahara | 324/158.1 |
| 5,818,748 | * 10/1998 | Bertin | 365/51 |
| 5,918,107 | * 6/1999 | Fogal | 438/15 |
| 6,107,119 | * 8/2000 | Farnworth | 438/106 |

* cited by examiner

*Primary Examiner*—John F. Niebling
*Assistant Examiner*—Andre Stevenson
(74) *Attorney, Agent, or Firm*—Townsend and Townsend and Crew LLP

(57) ABSTRACT

A semiconductor wafer has a plurality of dies separated by scribe line areas. Each die has a first pad for receiving a power supply voltage and a second pad for receiving a ground potential. The scribe line areas include at least a first metal line and a second metal line respectively connected to the first pad and the second pad of each of the plurality of dies. A probe card is brought into contact with a first die to initiate a built-in self test (BIST) in the first die. Once the BIST operation is properly initiated, the probe card is moved to a second die to similarly initiate the BIST operation in the second die. The probe card is moved from the first die to the second die while the BIST operation in first die is in progress. In this manner, the BIST operation in multiple dies overlap, thus reducing the overall wafer sort testing time compared to the conventional method of sequential testing of dies. The large capacitance associated with the first layer metal is capable of storing sufficient charge to provide the required power to the dies which have not completed the BIST operation but from which the probe card and thus the tester power is removed.

10 Claims, 1 Drawing Sheet

POWERING DIES ON A SEMICONDUCTOR WAFER THROUGH WAFER SCRIBE LINE AREAS

BACKGROUND OF THE INVENTION

This invention relates to semiconductor devices, and more particularly to a structure for and a method of supplying power to the dies on a wafer during wafer testing.

As the complexity of semiconductor devices increases, the amount of time required to properly test these devices also increases. For example, with advancing technology, memory devices increase in density and complexity, and the time to properly test all memory cells and the different functions of these memory devices increases significantly. Given the high volume production of some memory devices and other semiconductor devices, the increase in test time and the corresponding testing cost can significantly increase the cost of the product.

Conventional testing of semiconductor devices includes a number of steps which can broadly be grouped into two: (i) wafer sort, for identifying defective dies at wafer level, and (ii) final test, for identifying defective packaged devices. While at final test multiple packaged devices, e.g., 8, 16, or 64, can be tested simultaneously, at wafer sort, the dies are tested sequentially. Thus, wafer sort time is significantly longer than final test time.

Conventionally, each die on a wafer is tested by placing a probe card connected to a test equipment on the contact pads of the die. The probe card supplies the proper power supply levels and control signals to the contact pads on the die. The electrical contact between the probe card and the die contact pads is maintained until the testing of the die is completed. The probe card is then moved to the next die, and the same steps are repeated. Because the number of dies on a wafer is increasing rapidly due to the increasing wafer size and the decreasing processing feature sizes, this method of sequential testing of the dies on a wafer can significantly increase the wafer sort time and cost. Thus, reducing the wafer sort time is desirable.

SUMMARY OF THE INVENTION

In accordance with the present invention, wafer testing time is significantly reduced by initiating built-in self test (BIST) operation in each of the dies of the wafer in such way that the BIST operation in a number of the dies overlap.

In one embodiment, a semiconductor wafer has a plurality of dies separated by scribe line areas. Each die has a circuit, a first contact pad configured to receive a power supply voltage, and a second contact pad configured to receive a reference voltage. The first and second pads are coupled to the circuit for powering the circuit. The scribe line areas include at least a first conductive line and a second conductive line respectively connected to the first pad and the second pad of each of the dies.

In another embodiment, each die further includes a third contact pad configured to receive a control signal to initiate a built-in self test (BIST) operation. A probe card has at least three probe pins configured to provide the power supply voltage to the first pad, the reference voltage to the second pad, and the control signal to the third pad upon bringing the probe pins into electrical contact with the respective pads.

In another embodiment, the probe pins of the probe card are brought into electrical contact with corresponding pads of a first die to initiate a BIST operation in the first die, and after initiation but before completion of the BIST operation the probe pins are removed from the first die and brought into electrical contact with a second die to initiate a BIST operation in the second die.

In another embodiment, the first conductive line has a capacitance capable of storing and supplying sufficient charge to power the first die during the portion of the BIST operation when the probe pins are removed from the first die.

In another embodiment, the circuit includes a switch coupled between the first pad and an internal power bus connected to power terminals of circuit elements in the circuit, wherein the switch is closed only during BIST operation so that power is provided to the circuit only during BIST operation.

In accordance with another embodiment of the present invention, a method for testing a plurality of dies of a wafer includes the steps of: placing the wafer in a tester for testing the plurality of dies, initiating a built-in self test (BIST) operation in a first die; and initiating a BIST operation in a second die so that the BIST operation in the first die and the BIST operation in the second die overlap.

In another embodiment, each of the plurality of dies has a circuit, and the method further includes the steps of: upon initiating the BIST operation, supplying power to the circuit, performing designed-in test operations, storing in a register data reflecting the results of the designed-in test operations, and removing power to the circuit.

In another embodiment, the method further includes the step of: upon completion of the BIST operation for all the plurality of dies, evaluating the data stored in the register of each die to determine the action to be taken with respect to each die.

The following detailed description and the accompanying drawing provide a better understanding of the nature and advantages of the present invention.

DESCRIPTION OF THE SPECIFIC EMBODIMENTS

Figure 1:
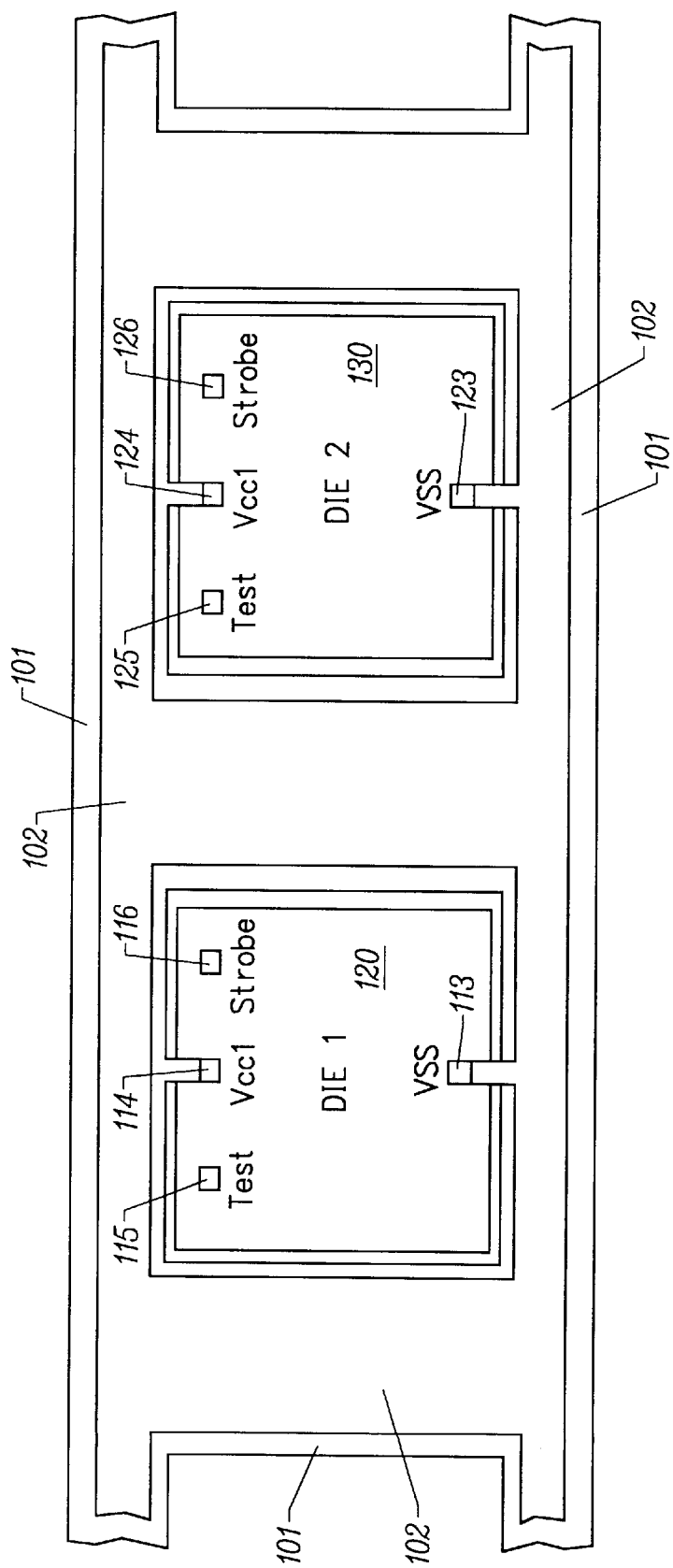
FIG. 1 illustrates a portion of a wafer including two dies and scribe line areas in accordance with the present invention.

FIG. 1 shows a portion of a wafer including two dies 120 and 130 in accordance with the present invention. Dies 120 and 130, as well as other dies on the wafer not shown are identical, although the invention is not limited to wafers with identical dies. Each of dies 120 and 130 includes a Vcc1 pad for receiving a power supply voltage, and a VSS pad for receiving a ground potential. The areas between the dies on a wafer are commonly referred to as the scribe line areas. Conventionally, one or more metal layers, which are grounded during wafer sort, run through the scribe line areas. Two metal lines 101 and 102 are shown running horizontally and vertically in the scribe line areas around dies 120 and 130.

Metal line 101 is electrically connected to the Vcc1 pads of dies 120 and 130, and thus carries the Vcc1 supply voltage during testing. Metal line 102 is electrically connected to the VSS pads of dies 120 and 130, and thus carries the ground potential during testing. Although FIG. 1 shows only two metal lines in the scribe line areas, the invention is not limited as such. Wafers having dies with additional power supply pads, e.g., VPP pad for receiving high voltage supply, may include additional metal lines in the scribe line areas for connection to these power supply pads. Also, metal lines 101 and 102 are shown as being stacked, and thus are from two separate metal layers. Either metal line can be from the top layer metal although in a preferred embodiment the top layer metal is connected to Vcc1 and the bottom layer metal is connected to VSS. Additional layers of metal in the scribe line area, if any, may be connected to the ground potential VSS.

In one embodiment, each die 120,130 includes a built-in self test (BIST) circuitry (not shown) which enables automatic testing of the die upon initiating a BIST operation. The BIST circuitry is conventionally designed to identify whether the die in which it is housed is defective, as well as the type of defects. Two additional pads, marked as Test and Strobe in each die 120,130, are used in the BIST operation. The Test pad is used to enable the BIST operation, and the Strobe pad is used to initiate the BIST operation. By requiring two signals to initiate BIST operation, accidental BIST initiation due to noise or other factors is prevented. Pad Vcc1 is used to provide power to the die during the BIST operation only. As such, a separate VCC pad (not shown) not connected to the metal lines in the scribe line areas is used to supply power to the die in all other die operations.

The wafer sort test, in accordance with one embodiment of the present invention, includes two steps: (i) initiate BIST operation, and (ii) follow-up operation. In the BIST initiating step, the probe card is placed on, for example, die 120. The probe card supplies the appropriate power supply voltages to Vcc1 and VSS pads, as well as the control signals to the Strobe and Test pads in order to initiate the BIST operation. Once the BIST operation is properly initiated in die 120, the probe card is moved to the next die, e.g., die 130, to similarly initiate the BIST operation in die 130. Thus, the probe card is moved from die 120 to die 130 while the BIST operation in die 120 continues and is eventually completed. Upon completion of the BIST operation, die 120 is automatically powered down to eliminate static power consumption by die 120. In this manner, the BIST operation in multiple dies overlap, reducing the overall wafer sort testing time compared to the conventional method of sequential testing of dies.

The BIST operation once initiated automatically performs the following steps: (i) perform designed-in test functions, (ii) store the test data reflective of the test results in one or more status registers, and (iii) power down the die. In one embodiment, upon initiation of the BIST operation, a switch, e.g., a MOS transistor, connected between Vcc1 pad and the internal power lines is closed by a BIST enable signal whereby power is transferred from Vcc1 pad to the internal circuitry. The switch is automatically opened upon completion of the BIST operation to cut off the power to the die. The status registers in this embodiment must be non-volatile (e.g., EPROM or Flash EPROM or EEPROM based) so that the stored test data is not lost when the power is removed from the die.

The Vcc1 pad of all dies on the wafer are shorted together via metal line 101. Thus, when the probe card contacts the Vcc1 pad of any die, power is supplied to all other dies via metal line 101. However, during the time the probe card transitions from one die to another, the power provided by the probe card is removed from the wafer. During this transition period, a number of dies may be at different stages of the BIST operation, and thus require power from another source. The large capacitance associated with metal line 101 supplies the requisite power to the dies during the transition period.

Because metal line 101 extends many times across the entire wafer, it possesses a large capacitance. Test equipment are typically capable of sourcing large amounts of current, e.g., more than 10 Amperes in the case of memory testers. Thus, the tester charges the large capacitance associated with metal line 101 every time the probe card comes in contact with the Vcc1 pad of a die. During the probe card transition period, the stored charge in metal line 101 capacitance provides the requisite power to those dies which are in the midst of the BIST operation.

Such reliance on the power provided by the charge stored in the capacitance of metal line 101 is quite reasonable because of: (i) the relatively small amount of power required by each die during BIST operation, e.g., 10–20 mA for memory devices, and (ii) the very short transition period of the probe card. In fact, the ratio of the time the probe card is in contact with each die to the time the probe card is in transition between dies can be adjusted so that metal line 101 remains fully charged during the transition periods. For example, the ratio may be set to 10:1 so that the probe card is in contact with each die for 10 seconds, and is in transition between two dies for 1 second. Clearly there are limitations on the ratio, such as how fast the tester can move the probe card form one die to another, and how quickly the BIST operation can be initiated.

The second step of follow-up operation in the wafer sort process involves evaluating the test data stored in the status registers in each die and performing the necessary steps indicated by the test data, e.g., repairing bad bits using redundancy, or discarding the die due to non-repairable defects. In the follow-up operation, open and short tests on all pins of each die may also be carried out.

The BIST initiating step may be carried out using a probe card having only the requisite number of probe pins for BIST initiation. In the embodiment of FIG. 1, only four probe pins are required for making contact to the four pads shown. For the follow-up operation, however, a different probe card with probe pins for all pads on the die, excluding Vcc1, Test and Strobe pads, may be used. This approach requires the additional step of changing the probe card after completion of the BIST initiation step, but minimizes the number of times the die pads are contacted by the probe pins of the probe cards. Excessive landing of probe pins on die pads can damage the pads and cause shorts or open failures. Alternatively, the step of changing probe cards between the two wafer sort steps can be eliminated at the expense of multiple landings on the die pads by using a single probe card with probe pins for all pads on the die, including Vcc1, Test, and Strobe pads.

In another embodiment, metal line 101 connected to Vcc1 pad of every die is powered by a power source other than the probe card. That is, metal line 101 is powered by a power source brought into electrical contact with metal line 101 at all times during wafer sort. In this embodiment, the reliance on the capacitance of metal layer 101 to provide the required power to the dies during probe card transition times is eliminated. Also, since power is provided to the dies at all times during wafer sort, the status registers used to store the test data in the BIST operation may be volatile, e.g., CMOS cross coupled latches. This simplifies the device processing requirements. Also, Vcc1 pad and the associated switch may be eliminated since the normal VCC pad can supply power to the die during BIST operation.

In yet another embodiment, the dies on the wafer are divided in a number of groups, and an algorithm is used to carry out the BIST operation for each group. The BIST operation is carried out in two steps for each group of dies. In the first step, the probe card sequentially contacts the dies in a first group to enable the BIST operation in these dies. In the second step, the BIST operation is initiated for all dies of the first group simultaneously.

During the first step, the dies in each group are merely enabled so that the BIST operation can later be initiated, and thus no power is consumed. In the first step, the probe card contacts the first die of the first group to enable the BIST operation in that die by initially raising the supply voltage applied to the Vcc pad to a first level, and then applying a BIST enable signal to the Test pad. The probe card then sequentially contacts the remaining dies of the first group to enable the BIST operation in each die. Upon contacting each of the remaining dies, the first voltage level is maintained on the Vcc1 pad and the BIST operation is enabled in the die by applying the BIST enable signal to the corresponding Test pad. Because the dies in the first group do not consume power during the BIST enable step, the first voltage level on metal line 101 can be maintained during the probe card transition between the dies in the group.

In the second step, after enabling the BIST operation in the last die of the first group of dies, and while maintaining the probe card on the last die, the BIST operation is initiated for all dies of the first group by switching the supply voltage applied to the Vcc1 pad to a second level.

After the BIST operation is completed for the first group of dies, the supply voltage applied to Vcc1 pad may be switched back to the first voltage level, and the same sequence of steps may be carried out to perform the BIST operation for another group of dies.

Conventional sensing techniques may be used to detect the first and second voltage levels. This embodiment has the advantages of minimizing the reliance on the capacitance of the metal line 101 to provide power to the dies during the probe card transition periods, and eliminate the need to retrofit the test apparatus to provide power to the metal lines 101 and 102 at all times during wafer sort.

While the above is a complete description of preferred embodiments of the present invention, it is possible to use various alternatives, modifications, and equivalents. For example, the present invention is not limited to using a single probe card for wafer sort. The present invention yields similar time savings in applications where two probe cards are used to test two dies simultaneously. Also, metal lines 101 and 102 are shown in FIG. 1 as being stacked, i.e., one metal line is from a first layer metal and the other metal line is from a second layer metal. However, metal lines 101 and 102 may be from the same layer metal running along the same plane. Further, the dies on the wafer may be divided into two or more groups with each group having independent VCC and VSS metal lines. Also, in each die only one power supply pad may be used to receive power for all operations rather than having a Vcc1 pad for BIST operation and a separate VCC pad for all other operations. Therefore, the scope of the present invention should be determined not with reference to the above description but should, instead, be determined with reference to the appended claims, along with their full scope of equivalents.

What is claimed is:

1. A structure comprising:
   a semiconductor wafer having:
      a plurality of dies separated by scribe line areas, each die having a circuit, a first contact pad configured to receive a power supply voltage, and a second contact pad configured to receive a reference voltage, the first and second pads being coupled to the circuit for powering the circuit; and
      at least a first conductive line and a second conductive line extending through the scribe line areas and being respectively connected to the first pad and the second pad of each of the plurality of dies.

2. The structure of claim 1 wherein each of said plurality of dies further includes a third contact pad configured to receive a control signal to initiate a built-in self test (BIST) operation, the structure further comprising a probe card having at least three probe pins configured to provide the power supply voltage to the first pad, the reference voltage to the second pad, and the control signal to the third pad upon bringing the probe pins into electrical contact with the respective pads.

3. The structure of claim 2 wherein the probe pins of the probe card are brought into electrical contact with corresponding pads of a first die of the plurality of dies to initiate a BIST operation in the first die, and after initiation but before completion of the BIST operation the probe pins being removed from the first die and brought into electrical contact with a second die of the plurality of dies to initiate a BIST operation in the second die.

4. The structure of claim 3 wherein the first conductive line has a capacitance capable of storing and supplying sufficient charge to power the first die during the portion of the BIST operation when the probe pins are removed from the first die.

5. The structure of claim 2 wherein the circuit includes a switch coupled between the first pad and an internal power bus connected to power terminals of circuit elements in the circuit, wherein the switch is closed only during BIST operation so that power is provided to the circuit only during BIST operation, or the switch is closed during wafer sort and the circuit is powered down upon completion of the BIST operation to eliminate static current drawn from the first pad after completion of the BIST operation.

6. The structure of claim 1 wherein the first conductive layer is electrically connected to a power supply voltage.

7. The structure of claim 1 wherein the first conductive layer extends across a substantial portion of the scribe line areas of the die.

8. The structure of claim 1 wherein the first conductive line and the second conductive line are respectively from a first layer metal and a second layer metal so that the first conductive line and second conductive lines are stacked on top of one another.

9. The structure of claim 1 wherein each die includes at least one register for storing the results of the BIST operation.

10. The structure of claim 9 wherein the at least one register includes a volatile or non-volatile storage element.

* * * * *